(12) United States Patent
Lin et al.

(10) Patent No.: US 11,328,931 B1
(45) Date of Patent: May 10, 2022

(54) METHOD OF MANUFACTURING A SEMICONDUCTOR DEVICE

(71) Applicant: TAIWAN SEMICONDUCTOR MANUFACTURING CO., LTD., Hsinchu (TW)

(72) Inventors: En-Ping Lin, Taoyuan (TW); Yu-Ling Ko, Hsinchu (TW); I-Chung Wang, Hsinchu (TW); Yi-Jen Chen, Hsinchu (TW); Sheng-Kai Jou, Taipei (TW); Chih-Teng Liao, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/175,396

(22) Filed: Feb. 12, 2021

(51) Int. Cl.
*H01L 21/3065* (2006.01)
*H01L 21/308* (2006.01)
*H01L 21/8238* (2006.01)

(52) U.S. Cl.
CPC ........ *H01L 21/3065* (2013.01); *H01L 21/308* (2013.01); *H01L 21/823821* (2013.01)

(58) Field of Classification Search
None
See application file for complete search history.

(56) References Cited

U.S. PATENT DOCUMENTS

| 6,573,190 B1* | 6/2003 | Izawa | H01J 37/3266 438/728 |
|---|---|---|---|
| 2016/0300697 A1* | 10/2016 | Whang | H01J 37/321 |
| 2019/0088453 A1* | 3/2019 | Sonoda | H01J 37/32266 |
| 2020/0286715 A1* | 9/2020 | Ikeda | H01J 37/32311 |

* cited by examiner

*Primary Examiner* — Allan W. Olsen
(74) *Attorney, Agent, or Firm* — McDermott Will & Emery LLP

(57) ABSTRACT

In a method of manufacturing a semiconductor device, a mask pattern is formed over a target layer to be etched, and the target layer is etched by using the mask pattern as an etching mask. The etching is performed by using an electron cyclotron resonance (ECR) plasma etching apparatus, the ECR plasma etching apparatus includes one or more coils, and a plasma condition of the ECR plasma etching is changed during the etching the target layer by changing an input current to the one or more coils.

20 Claims, 13 Drawing Sheets

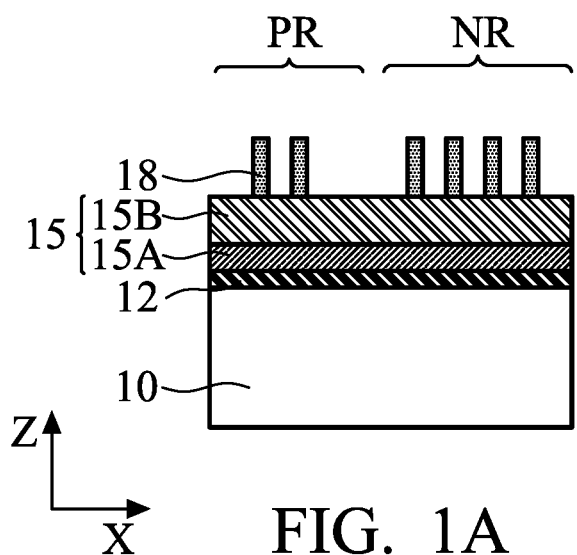
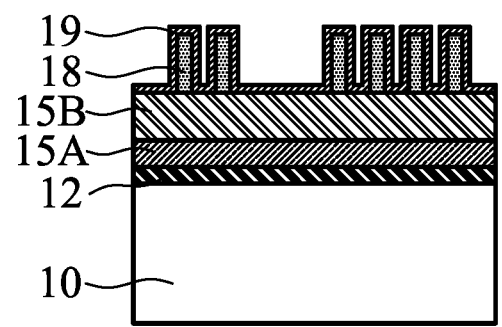
FIG. 1A  FIG. 1B
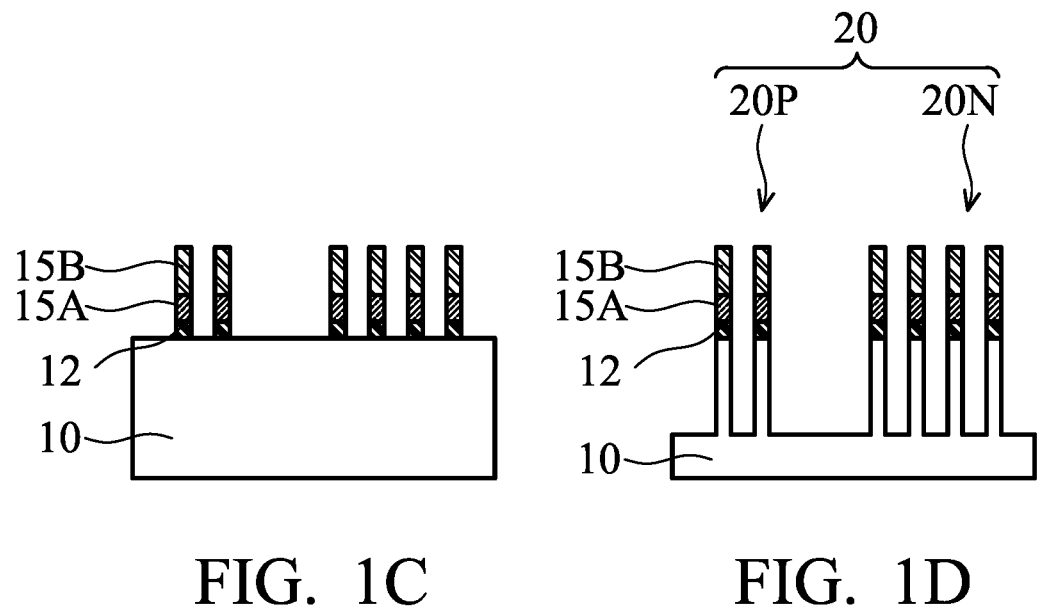
FIG. 1C  FIG. 1D

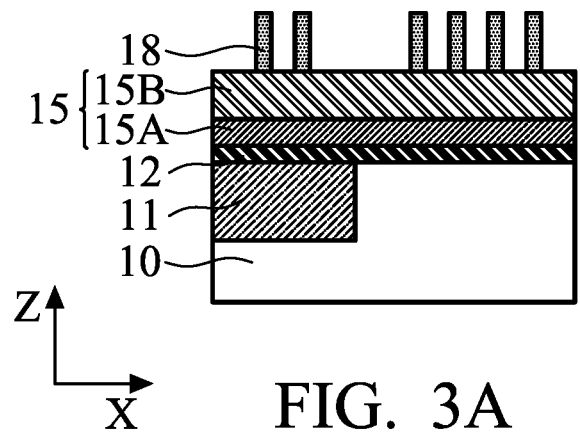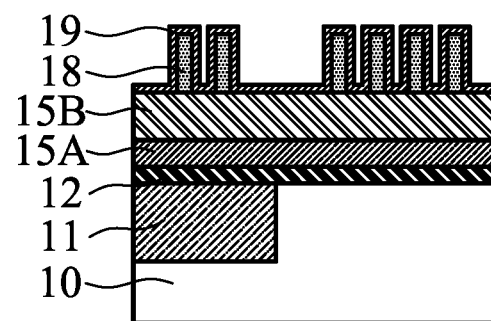
FIG. 3A  FIG. 3B
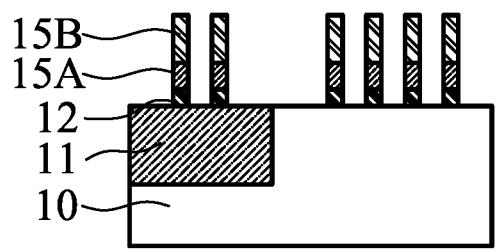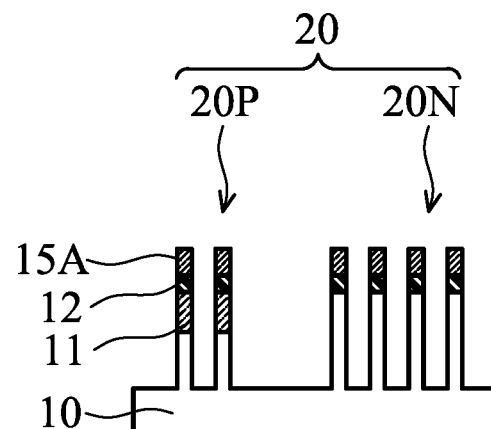
FIG. 3C  FIG. 3D

| Remarks | Etching condition | | | | | | | | | | | Cycle |
|---|---|---|---|---|---|---|---|---|---|---|---|---|
| | Gas Flow Rate (ml/min) | | | | | | Coil | | | | |
| | Cl2 | CHF3 | SF6 | NF3 | H2 | He | Ar | A | | | | |
| | | | | | | | | 210 | 220 | 230 | | |
| M-ME1 | F11 | F21 | F31 | F41 | F51 | F61 | F71 | I11 | I21 | I31 | Middle cycle-1 |
| M-ME2 | F12 | F22 | F32 | F42 | F52 | F62 | F72 | I12 | I22 | I32 | |
| M-ME1 | F13 | F23 | F33 | F43 | F53 | F63 | F73 | I13 | I23 | I33 | Middle cycle-2 |
| M-ME2 | F14 | F24 | F34 | F44 | F54 | F64 | F74 | I14 | I24 | I34 | |
| M-ME1 | F15 | F25 | F35 | F45 | F55 | F65 | F75 | I15 | I25 | I35 | Middle cycle-3 |
| M-ME2 | F16 | F26 | F36 | F46 | F56 | F66 | F76 | I16 | I26 | I36 | |
| M-ME1 | F17 | F27 | F37 | F47 | F57 | F67 | F77 | I17 | I27 | I37 | Middle cycle-4 |
| M-ME2 | F18 | F28 | F38 | F48 | F58 | F68 | F78 | I18 | I28 | I38 | |

FIG. 9C

METHOD OF MANUFACTURING A SEMICONDUCTOR DEVICE

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (FinFET) and a gate-all-around (GAA) FET. As transistor dimensions are continually scaled down to sub 10-15 nm technology nodes, further improvements of the FinFET, for example, a precise critical dimension (CD) control, are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A, 1B, 1C and 1D show cross sectional views of various stages of a sequential process for manufacturing a FinFET device according to an embodiment of the present disclosure.

FIGS. 3A, 3B, 3C, and 3D show cross sectional views of various stages of a sequential process for manufacturing a FinFET device according to an embodiment of the present disclosure.

FIG. 9B shows an etching process for patterning fin structures and FIG. 9C shows source gases used in the process according to an embodiment of the present disclosure.

DETAILED DESCRIPTION

Figure 2A:
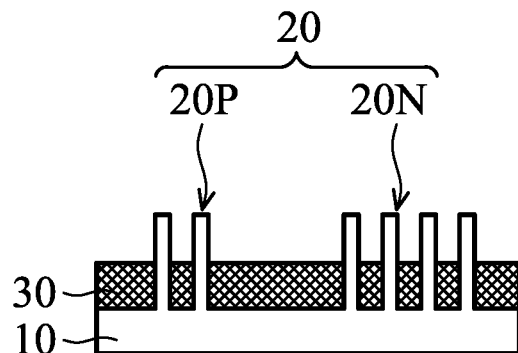
FIGS. 2A, 2B, 2C, 2D, 2E and 2F show cross sectional views of various stages of a sequential process for manufacturing a FinFET device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described. In the entire disclosure, a source and a drain are interchangeably used, and a source/drain refers to one of or both of the source and the drain. In the following embodiments, materials, configurations, dimensions, processes and/or operations as described with respect to one embodiment (e.g., one or more figures) may be employed in the other embodiments, and detailed description thereof may be omitted.

FIGS. 1A-2E show a sequential process for manufacturing a FinFET device according to an embodiment of the present disclosure. It is understood that additional operations can be provided before, during, and after processes shown by FIGS. 1A-2E, and some of the operations described below can be replaced or eliminated, for additional embodiments of the method. The order of the operations/processes may be interchangeable.

In some embodiments, as shown in FIG. 1A, a hard mask layer 15 is formed over a substrate 10. In one embodiment, substrate 10 includes a single crystalline semiconductor layer on at least it surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In one embodiment, the substrate 10 is made of Si. The substrate 10 may include various regions that have been suitably doped with impurities (e.g., p-type or n-type conductivity). The dopants are, for example boron ($BF_2$) for an n-type Fin FET and phosphorus for a p-type Fin FET.

In some embodiments, the mask layer 15 includes a first mask layer 15A and a second mask layer 15B. In some embodiments, the first mask layer 15A includes a silicon nitride layer, and the second mask layer 15B includes a silicon oxide layer. The first and second mask layers 15A and 15B are formed by chemical vapor deposition (CVD), physical vapor deposition (PVD) including sputtering, atomic layer deposition (ALD), or other suitable film formation process. In some embodiments, a pad oxide layer 12 made of a silicon oxide, which can be formed by a thermal oxidation, is formed before the first mask layer 15A is formed.

Further, as shown in FIG. 1A, a mask pattern 18 is formed over the second mask layer 18. In some embodiments, the mask pattern 18 is made of, for example, silicon nitride. In some embodiments, the mask pattern includes a plurality of line patterns corresponding to one or more fin structures in a p-type region PR and one or more fin structures for an n-type region NR. In some embodiments, a pitch of the mask pattern 18 in the p-type region is greater than a pitch of the mask pattern 18 in the n-type region.

Further, as shown in FIG. 1B, a cap layer 19 is further formed over the mask pattern 18 in some embodiments. In some embodiments, the cap layer 19 is made of, for example, silicon nitride. In some embodiments, the cap layer 19 is formed by ALD. In some embodiments, a thickness of the cap layer 19 is in a range from about 0.5 nm to about 5 nm.

Then, the mask layer 15 and the pad oxide layer 12 are patterned by using one or more etching operations, as shown in FIG. 1C. Further, the substrate 10 is patterned by using the patterned mask layer as an etching mask, thereby forming fin structures 20N and 20P (collectively fin structures 20) extending in the Y direction. In some embodiments, the fin structures 20N are for an n-type FET, and the fin structures 20P are for a p-type FET. In FIG. 1D, two fin structures 20P are arranged in the X direction in the p-type region and four fin structures 20N are arranged in the X direction in the n-type region. But the number of the fin structures is not limited to two or four, and may be as small as one and three or more. In some embodiments, one or more dummy fin structures are formed on both sides of the fin structures 20 to improve pattern fidelity in the patterning operations.

In other embodiments, the fin structures 20 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structures, for example, the mask pattern 18. The multi-patterning processes combining photolithography and self-aligned processes generally result in forming a pair of fin structures.

After the fin structures 20 are formed, an insulating material layer including one or more layers of insulating material is formed over the substrate so that the fin structures 20 are fully embedded in the insulating layer. The insulating material for the insulating layer may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-CVD or flowable CVD. An anneal operation may be performed after the formation of the insulating layer. Then, a planarization operation, such as a chemical mechanical polishing (CMP) method and/or an etch-back method, is performed such that the upper surfaces of the fin structures 20 are exposed from the insulating material layer. Then, as shown in FIG. 2A, the insulating material layer is recessed to form an isolation insulating layer 30 so that the upper portions (channel regions) of the fin structures 20 are exposed. With this operation, the fin structures 20 are electrically separated from each other by the isolation insulating layer 30, which is also called a shallow trench isolation (STI).

Figure 2B:
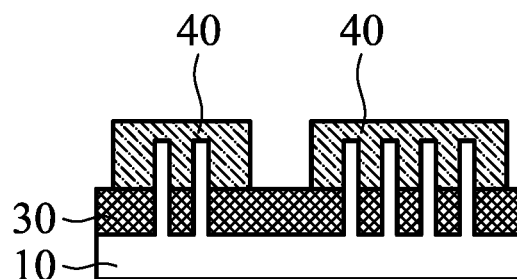

After the isolation insulating layer 30 is formed, a sacrificial gate structures 40 are formed over the fin structures, as shown in FIG. 2B. In some embodiments, the sacrificial gate structure 30 includes a sacrificial dielectric layer, a sacrificial gate electrode layer and a hard mask layer. The sacrificial gate dielectric layer includes one or more layers of insulating material, such as a silicon oxide-based material. In one embodiment, silicon oxide formed by CVD is used. The thickness of the sacrificial gate dielectric layer is in a range from about 1 nm to about 5 nm in some embodiments. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. The hard mask layer is used to form the sacrificial gate electrode layer and includes one or more layers of silicon nitride and silicon. In some embodiments, the sacrificial gate dielectric layer also cover the source/drain region of the fin structures 20.

After the sacrificial gate structure 40 is formed, a blanket layer of an insulating material for sidewall spacers is conformally formed by using CVD or other suitable methods. The blanket layer is deposited in a conformal manner so that it is formed to have substantially equal thicknesses on vertical surfaces, such as the sidewalls, horizontal surfaces, and the top of the sacrificial gate structure. In some embodiments, the blanket layer is deposited to a thickness in a range from about 2 nm to about 10 nm. In one embodiment, the insulating material of the blanket layer is a silicon nitride-based material, such as SiN, SiON, SiOCN or SiCN and combinations thereof. The sidewall spacers are formed on opposite sidewalls of the sacrificial gate structures 40.

In the embodiment of FIG. 2B, one sacrificial gate structure 40 is disposed over two fin structures 20P in the p-type region, and one sacrificial gate structure 40 is disposed over four fin structures 20N in the n-type region. But the number of the fin structures per sacrificial gate structure is not limited, and can be one, two, three or more than four. In other embodiments, one sacrificial gate structure is formed over one or more n-type fin structures 20N and one or more p-type fin structures 20P.

Subsequently, a source/drain epitaxial layer is formed. In some embodiments, the fin structures of source/drain regions are recessed down below the upper surface of the isolation insulating layer 30 by using dry etching and/or wet etching, and then one or more semiconductor layers are epitaxially formed over the recessed fin structures. In other embodiments, one or more semiconductor layers are epitaxially formed over the source/drain region of the non-recessed fin structure. The source/drain epitaxial layer for an n-type FET includes one or more layers of SiC, SiP and SiCP, and the source/drain epitaxial layer for a p-type FET includes one or more layers of SiGe, SiGeSn, which may be doped with B. In at least one embodiment, the epitaxial layers are epitaxially-grown by an LPCVD process, molecular beam epitaxy, atomic layer deposition or any other suitable method. The LPCVD process is performed at a temperature of about 400 to 850° C. and under a pressure of about 1 Torr to 200 Torr, using silicon source gas such as $SiH_4$, $Si_2H_6$, or $Si_3H_8$; germanium source gas such as $GeH_4$, or $G_2H_6$; carbon source gas such as $CH_4$ or $SiH_3CH_3$; phosphorus source gas such as $PH_3$; and/or boron source gas such as $B_2H_6$. In some embodiments, two or more layers with different composition (e.g., different P, C, Ge and/or B concentrations) are formed as the source/drain epitaxial layers.

Figure 2C:
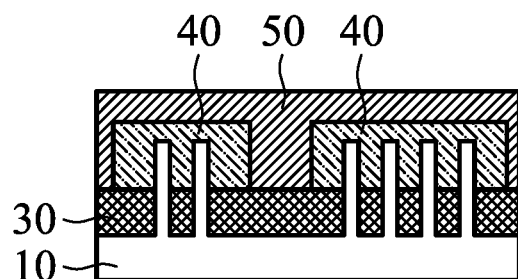

Subsequently, a first interlayer dielectric (ILD) layer 50 is formed over the source/drain epitaxial layers and the sacrificial gate structures 40, as shown in FIG. 2C. Then, a planarization operation, such as CMP, is performed, so that the top portion of the sacrificial gate electrode layer is exposed. The materials for the first ILD layer 50 include compounds comprising Si, 0, C and/or H, such as silicon oxide, SiCOH and SiOC. Organic materials, such as polymers, may be used for the first ILD layer 50.

Figure 2D:
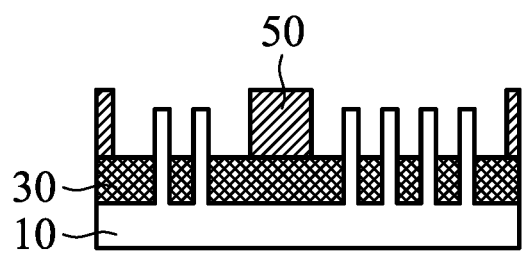

Next, the sacrificial structure 40 including sacrificial gate electrode layer and the sacrificial gate dielectric layer are removed, thereby exposing the upper portions (channel regions) of the fin structures 20, as shown in FIG. 2D. The sacrificial gate structures 40 can be removed using plasma dry etching and/or wet etching. When the sacrificial gate electrode layer is polysilicon and the first ILD layer 50 is silicon oxide, a wet etchant such as a TMAH solution can be used to selectively remove the sacrificial gate electrode layer. The sacrificial gate dielectric layer is thereafter removed using plasma dry etching and/or wet etching.

Figure 2E:
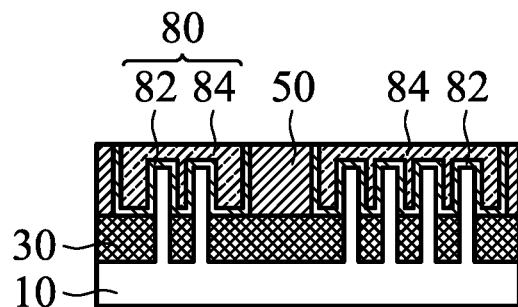

After the sacrificial gate structures are removed, a gate dielectric layer 82 is formed over channel regions (upper portions of the fin structure 20 above the isolation insulating layer 30), and a gate electrode layer 84 is formed on the gate dielectric layer 82, as shown in FIG. 2E.

In certain embodiments, the gate dielectric layer 82 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 82 includes an interfacial layer formed between the channel layers and the dielectric material.

The gate dielectric layer 82 may be formed by CVD, ALD or any suitable method. In one embodiment, the gate dielectric layer 82 is formed using a highly conformal deposition process such as ALD in order to ensure the formation of a gate dielectric layer having a uniform thickness over each channel layers. The thickness of the gate dielectric layer 82 is in a range from about 1 nm to about 6 nm in one embodiment.

The gate electrode layer 84 is formed on the gate dielectric layer 82. The gate electrode 84 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 84 may be formed by CVD, ALD, electro-plating, or other suitable method. The gate electrode layer is also deposited over the upper surface of the first ILD layer 50. The gate dielectric layer and the gate electrode layer formed over the first ILD layer 50 are then planarized by using, for example, CMP, until the top surface of the first ILD layer 50 is revealed. In some embodiments, after the planarization operation, the gate electrode layer 84 is recessed and a cap insulating layer is formed over the recessed gate electrode 84. The cap insulating layer includes one or more layers of a silicon nitride-based material, such as SiN. The cap insulating layer can be formed by depositing an insulating material followed by a planarization operation.

In certain embodiments of the present disclosure, one or more work function adjustment layers (not shown) are interposed between the gate dielectric layer 82 and the gate electrode 84. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

It is understood that the semiconductor device shown in FIG. 2E undergoes further CMOS processes to form various features such as contacts/vias, interconnect metal layers, dielectric layers, passivation layers, etc.

FIGS. 3A-3D show a sequential process for manufacturing a FinFET device according to an embodiment of the present disclosure. It is understood that additional operations can be provided before, during, and after processes shown by FIGS. 3A-3D, and some of the operations described below can be replaced or eliminated, for additional embodiments of the method. The order of the operations/processes may be interchangeable. Materials, configurations, dimensions, processes and/or operations as described with respect to the foregoing embodiments may be employed in the following embodiments, and detailed description thereof may be omitted. In this embodiment, the channel region of p-type FETs include SiGe.

In some embodiments, a part of a substrate 10 corresponding to the p-type region(s) is etched to form a recess by one or more lithography and etching operations. Then, an epitaxial layer 11 is formed in the recess. In some embodiment, the epitaxial layer 11 is made of SiGe. In some embodiments, the germanium concentration of the SiGe layer 11 is in a range from about 5 atomic % to about 30 atomic %. In some embodiments, one or more buffer layer having a lower Ge concentration than the epitaxial layer 11 is formed between the epitaxial layer 11 and the substrate 10. The SiGe layer 11 can be formed by CVD, such as low pressure CVD (LPCVD) and plasma enhanced CVD (PECVD), physical vapor deposition (PVD), atomic layer deposition (ALD), molecular beam epitaxy (MBE), or any other suitable process. In some embodiments, after the epitaxial layer 11 is formed, a CMP operation is performed. The thickness of the epitaxially grown SiGe layer 11 (the depth of the recess) is in a range from about 30 nm to about 100 nm in some embodiments, and is in a range from 40 nm to 80 nm in other embodiments.

Figure 2F:
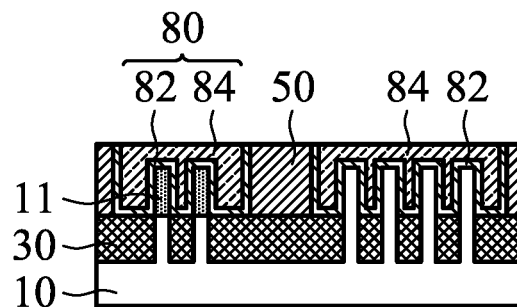

Then, the same as or similar operations to those explained with respect to FIGS. 1A-1D are performed as shown in FIGS. 3A-3D, thereby forming p-type fin structures 20P each having a SiGe layer for a channel region and n-type fin structures 20N. Subsequently, the same as or similar operations to those explained with respect to FIGS. 2A-2E are performed, and a p-type FinFET and an n-type FinFET are formed as shown in FIG. 2F.

FIGS. 4A-5D show a sequential process for manufacturing a FinFET device according to an embodiment of the present disclosure. It is understood that additional operations can be provided before, during, and after processes shown by FIGS. 4A-5D, and some of the operations described below can be replaced or eliminated, for additional embodiments of the method. The order of the operations/processes may be interchangeable. Materials, configurations, dimensions, processes and/or operations as described with respect to the foregoing embodiments may be employed in the following embodiments, and detailed description thereof may be omitted. In this embodiment, the channel region of p-type FETs include SiGe, and etchings for forming p-type fin structures and n-type fin structures are separately performed.

Figure 4A:
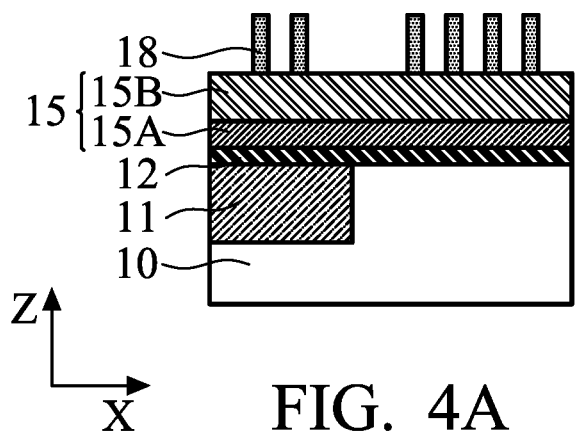
FIGS. 4A, 4B, 4C and 4D show cross sectional views of various stages of a sequential process for manufacturing a FinFET device according to an embodiment of the present disclosure.
Figure 4B:
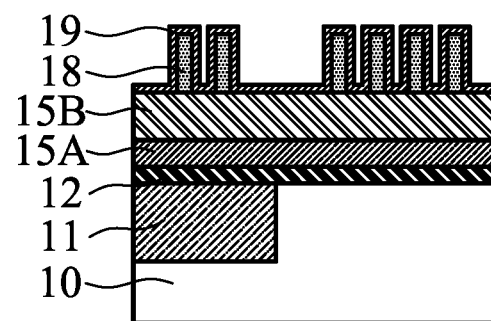
Figure 4C:
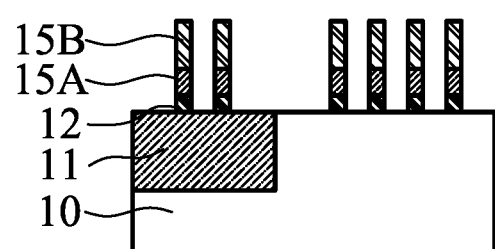
Figure 4D:
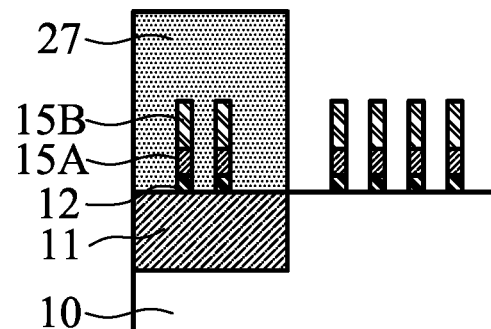
Figure 5A:
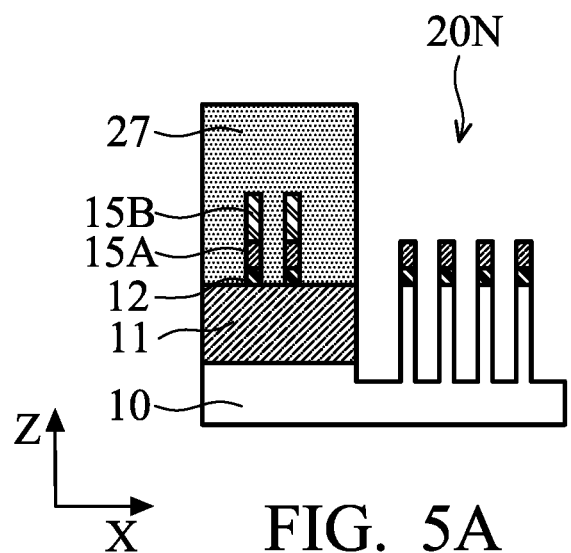
FIGS. 5A, 5B, 5C and 5D show cross sectional views of various stages of a sequential process for manufacturing a FinFET device according to an embodiment of the present disclosure.
Figure 5B:
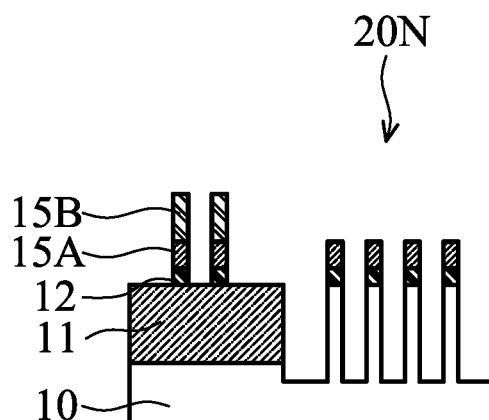
Figure 5C:
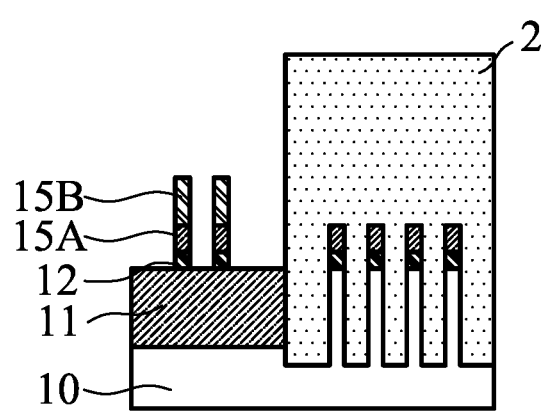
Figure 5D:
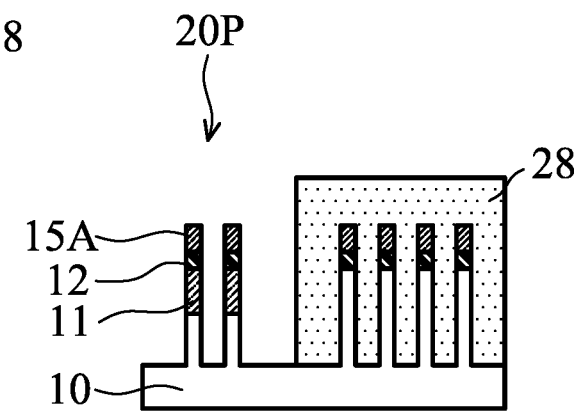

FIGS. 4A-4C are the same as FIGS. 3A-3C. As shown in FIG. 4D, the p-type region is covered by a cover layer 27, for example, a photo resist pattern. Then, as shown in FIG. 5A, the n-type fin structures 20N are formed by one or more plasma dry etching operations. Thereafter, the cover layer 27 is removed as shown in FIG. 5B. As shown in FIG. 5C, the n-type region is covered by a cover layer 28, for example, a photo resist pattern. Then, as shown in FIG. 5D, the p-type fin structures 20P are formed by one or more plasma dry etching operations. Thereafter, the cover layer 28 is removed, which results in the same or similar structure show in FIG. 3D. Subsequently, the same as or similar operations to those explained with respect to FIGS. 2A-2E are performed, and a p-type FinFET and an n-type FinFET are formed as shown in FIG. 2F. In other embodiments, the n-type fin structures 20N are first formed and then the p-type fin structures 20P are formed.

In a FinFET, one or more device performances are affected by a channel profile (shape) design, and the channel profile is often dependent on the etching conditions to form the fin structures. In some embodiments, at least the channel region of the fin structure is designed to have a constant width along the vertical direction. In other embodiments, the width of at least the channel region of the fin structure is designed to vary along the vertical direction.

In some embodiments, the device performances include, a driving current, a threshold voltage, an off-current (Ioff), a switching speed, a power consumption, a drain induced barrier lowering (DIBL) property, local current density or any other electrical properties of the FET device. Further, the geometrical requirements also define the profile (shape) of the fin structures. For example, in some embodiments, an epitaxial semiconductor layer is formed over the source/drain region of the fin structure, and the shape of the epitaxial layer may depend on the shape of the fin structure. When two fin structures are arranged adjacent to each other and source/drain epitaxial layer should be separated, the fin structure is designed to locally have a narrow width at the location (height/level) where the source/drain epitaxial layer has a largest width. In view of one or more of the device performance or process requirements, the required profile of the fin structures is determined.

Figure 6:
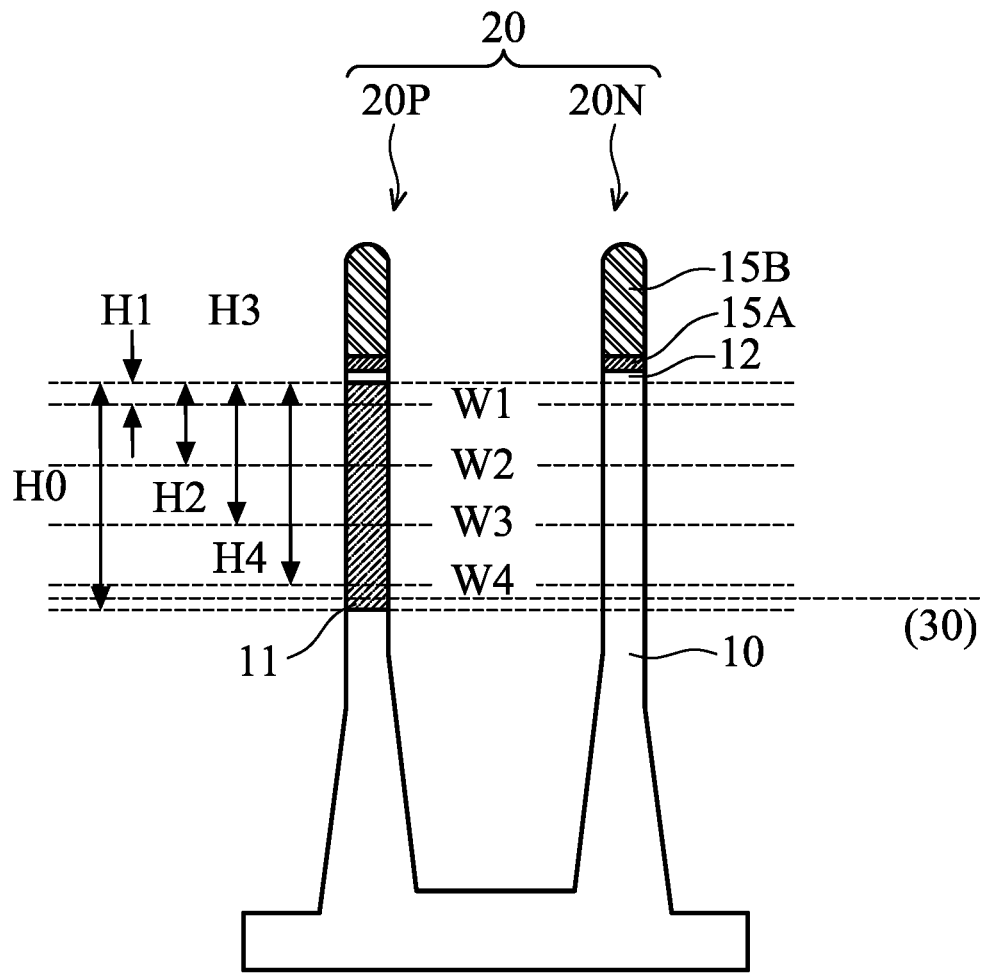
FIG. 6 shows a vertical profile (shape) of a fin structure according to an embodiment of the present disclosure.

FIG. 6 shows a vertical profile (shape) of a fin structure according to an embodiment of the present disclosure.

The area (length) H0 subjected to designing or optimizing the profile of the fin structure substantially corresponds to a channel region of the fin structure, which protrudes from the isolation insulating layer 30 and is covered by a gate structure. In some embodiments, the designed area H0 is downwardly measured from the top of the fin structure 20 (interface between the fin structure and the pad oxide layer 12). For the p-type fin structure 20P, the SiGe layer 11 substantially corresponds to the channel region. In some embodiments, the designed area H0 is greater than the length of the channel region by about 1-10 nm, and thus the upper surface of the isolation insulating layer 30 is located above the interface between the SiGe layer 11 and the bottom fin structure made of Si.

In some embodiments, the designed area H0 is in a range from about 40 nm to about 120 nm depending on the device requirements. In some embodiments, the designed area H0 is in a range from about 50 nm to about 70 nm. In some embodiments, designed widths of the designed area are set at multiple points (multiple levels). In some embodiments, the number of the multiple points is any number between 2 to 20. In one embodiments, the number of the multiple points is four as shown in FIG. 6. In some embodiments, the designed width W1 is a width at a level H1 from the top of the fin structure, the designed width W2 is a width at a level H2 from the top of the fin structure, the designed width W3 is a width at a level H3 from the top of the fin structure, and the designed width W4 is a width at a level H4 from the top of the fin structure. In some embodiments, H1 is about 5-15% of H0, H2 is about 30-55% of H0, H3 is about 60-75% of H0, and H4 is about 85-95% of H0. In certain embodiments, H1 is about 10% of H0, H2 is about 50% of H0, H3 is about 70% of H0, and H4 is about 90% of H0. In other embodiments, H1 is about 8% ($\frac{1}{12}$) of H0, H2 is about 33% ($\frac{1}{3}$) of H0, H3 is about 66% ($\frac{2}{3}$) of H0, and H4 is about 92% ($\frac{11}{12}$) of H0. In a specific embodiment, H0 is 60 nm, H1 is 5 nm, H2 is 28 nm, H3 is 40 nm and H4 is 54 nm. In some embodiments, all the multiple points are set at equal intervals, and in other embodiments, the multiple points, except the top and the bottom, are set at equal intervals.

In some embodiments, W1, W2, W3 and W4 satisfy W1<W2<W3<W4 for an n-type fin structure 20N, and W1, W2, W3 and W4 satisfy W1<W2<W3<W4 for a p-type fin structure 20P. In some embodiments, W2 is from about 1.02×W1 to about 1.06×W1, W3 is from about 1.11×W1 to about 1.15×W1, and W4 is from about 1.15×W1 to about 1.19×W1, for an n-type fin structure 20N, and W2 is from about 1.01×W1 to about 1.05×W1, W3 is from about 1.04×W1 to about 1.08×W1, and W4 is from about 1.16×W1 to about 1.20×W1, for a p-type fin structure 20N. In some embodiments, W2 is from about 1.01×W1 to about 1.05×W1, W3 is from about 1.05×W1 to about 1.09×W1, and W4 is from about 1.12×W1 to about 1.16×W1, for an n-type fin structure 20N, and W2 is from about 1.005×W1 to about 1.03×W1, W3 is from about 1.02×W1 to about 1.06×W1, and W4 is from about 1.14×W1 to about 1.18×W1, for a p-type fin structure 20N.

In some embodiments, W1, W2, W3 and W4 satisfy W1<W2<W3<W4 for an n-type fin structure 20N, and W1, W2, W3 and W4 satisfy W2<W1<W3<W4 for a p-type fin structure 20P. In some embodiments, W2 is from about 1.01×W1 to about 1.05×W1, W3 is from about 1.07×W1 to about 1.09×W1, and W4 is from about 1.09×W1 to about 1.13×W1, for an n-type fin structure 20N, and W2 is from about 0.95×W1 to about 0.99×W1, W3 is from about 1.04×W1 to about 1.08×W1, and W4 is from about 1.12×W1 to about 1.16×W1, for a p-type fin structure 20N.

The aforementioned fin profile can be obtained by adjusting one or more plasma etching conditions for patterning the fin structures. In some embodiments of the present disclosure, an electron cyclotron resonance (ECR) plasma etching apparatus is used.

Figure 7:
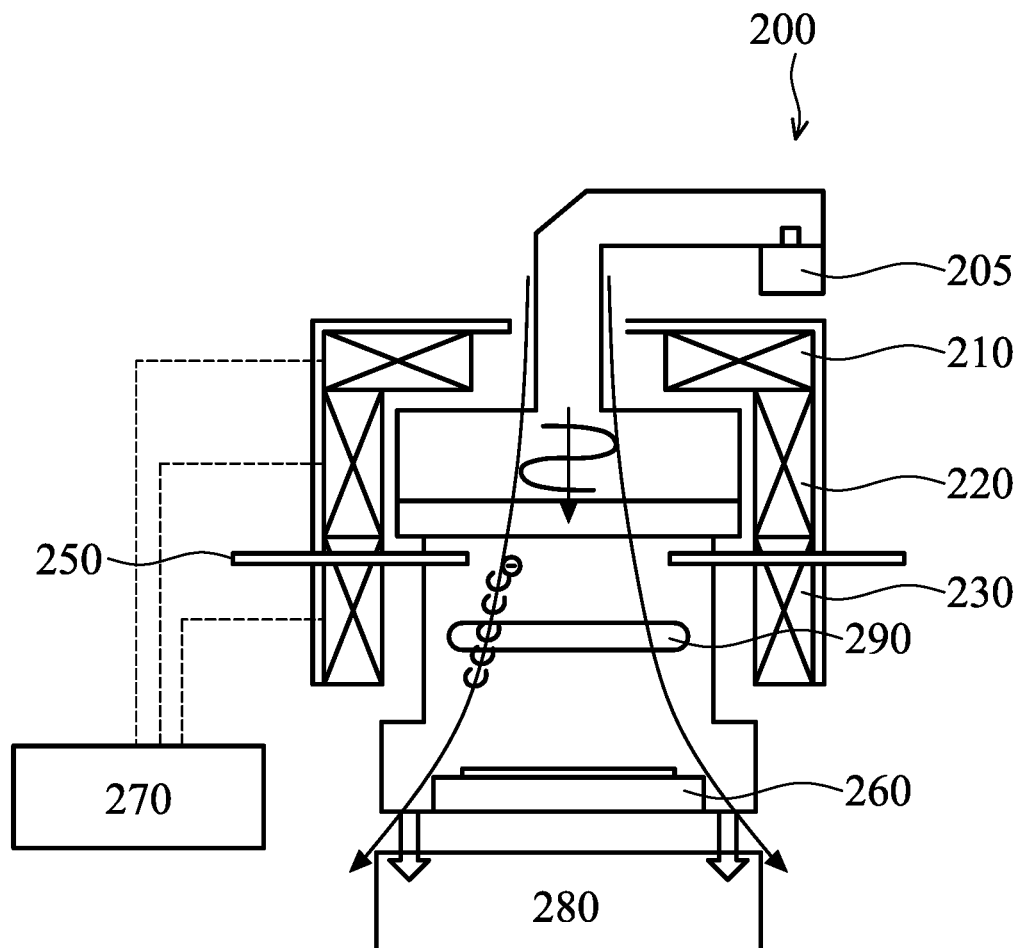
FIG. 7 is a schematic view of an ECR plasma etching apparatus 200 according to an embodiment of the present disclosure.

FIG. 7 is a schematic view of an ECR plasma etching apparatus 200 according to an embodiment of the present disclosure. The ECR plasma etching apparatus 200 includes a microwave generator 205, which generates microwave power (e.g., 2.45 GHz), coupled to a chamber via a waveguide. Multiple coils 210, 220 and 230 are disposed around the chamber as shown in FIG. 7. Input currents to the multiple coils are individually controlled by a controller 270 including one or more current sources. In some embodiments, the number of the coils is three, but the number of the coils it not limited, and it may be 2, 4 and 5, or more. The chamber is separated by a plate (e.g., glass or quartz plate) into a microwave power zone and a plasma generating zone. In some embodiments, one or more gas inlets 250 are provided to introduce one or more source gases into the plasma generating zone. Further, a wafer stage 260 is provided in the plasma generating zone of the chamber and a vacuum is maintained in the plasma generating zone by one or more vacuum pumps 280.

As well-known in plasma physics, ECR occurs when the frequency of incident radiation (e.g., microwave) coincides with the natural frequency of rotation of electrons in magnetic fields. A free electron in a static and uniform magnetic field moves in a circle due to the Lorentz force. The circular motion is superimposed with a uniform axial motion, resulting in a helix, or with a uniform motion perpendicular to the field (e.g., in the presence of an electrical or gravitational field) resulting in a cycloid. The angular frequency ($\omega=2\pi f$) of this cyclotron motion for a given magnetic field strength B is given by $\omega_{ce}=eB/m_c$, where e is the elementary charge and m is the mass of the electron. When the microwave frequency is 2.45 GHz, the resonance condition is met when B=875 G=0.0875 T. In the ECR plasma apparatus, the magnetic field is generated by the coils. The magnetic field strength B generated by a coil is given by B=μH, and H (magnetic field strength) is proportional to the input current I and turns n of the coil. Generally, light emission is observed at the ECR zone 290 which is a plasma generate area above the stage 260 at about 120 mm to about 200 mm depend on the coil current setting.

Figure 8A:
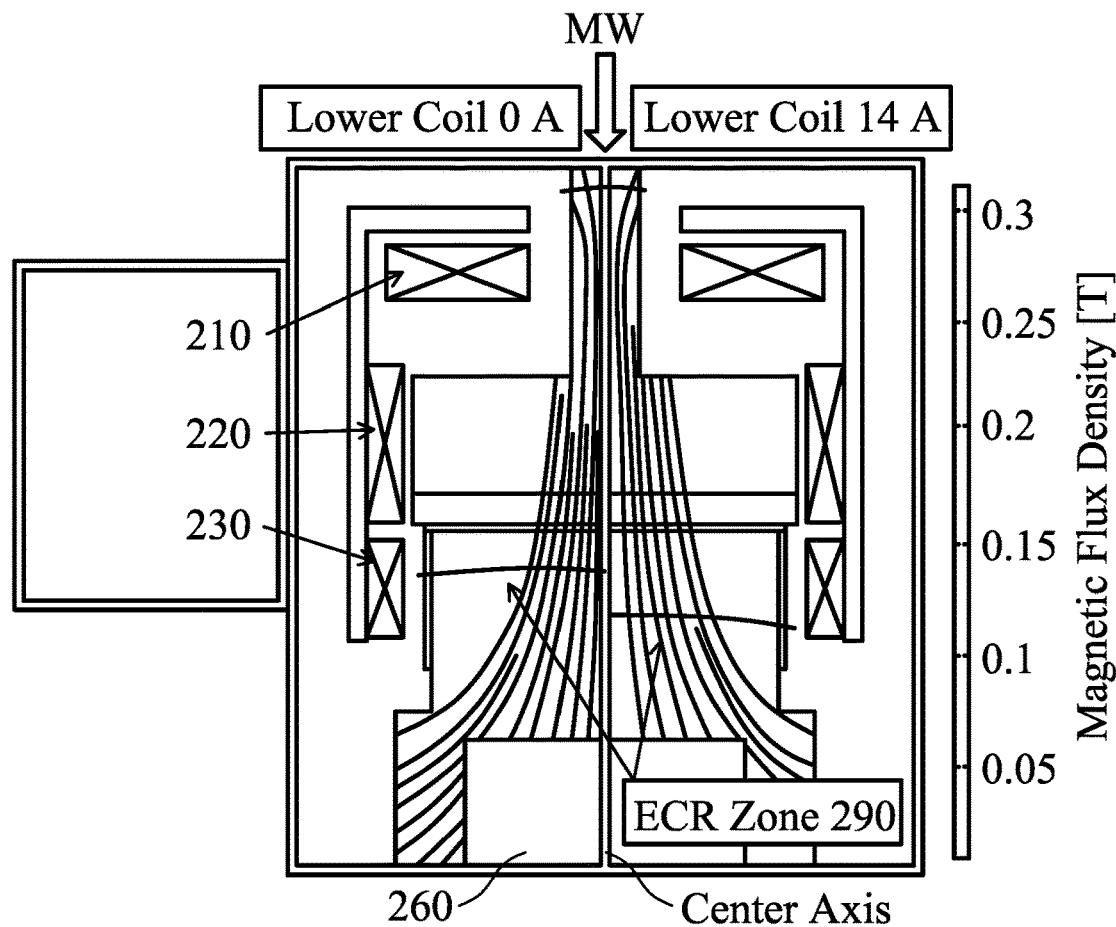
FIGS. 8A and 8B show adjusting an ECR zone by adjusting coil currents according to embodiments of the present disclosure.
Figure 8B:
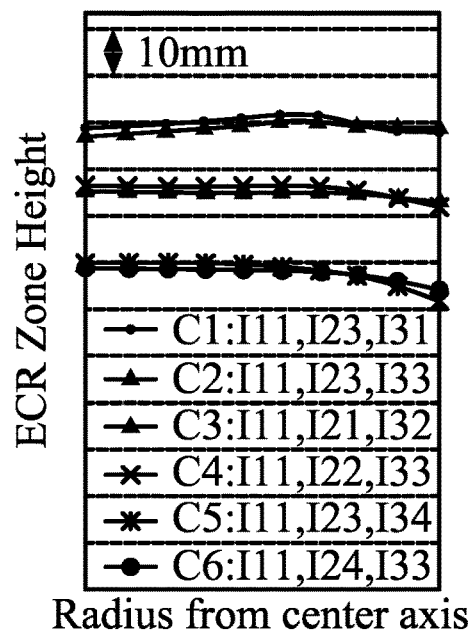

In some embodiments of the present disclosure, the location of the ECR zone 290 is adjusted by adjusting an input current of one or more coils 210, 220 and 230. FIGS. 8A and 8B show adjusting an ECR zone by adjusting coil currents according to embodiments of the present disclosure.

FIG. 8A shows the locations of the ECR zone 290 in the case where the input current to the lower coil 230 is 0 A and in the case where the input current to the lower coil is 14 A. Depending on the coil current, the magnetic flux changes and thus the location of the ECR zone 290 also changes.

FIG. 8B shows ECR zone height (height of the center of the ECR zone) along the radius direction from the center axis (e.g., the center axis of the coils) with various current conditions. The current I1n, I2n and I3n (n is 1, 2, 3, 4) are input currents to the coil 201, coil 220 and coil 230 respectively. In some embodiments, I1 is greater than I2n, and I2n is greater than I3n in each current conditions C1-C6, I21<I22<I23<I24, and I31<I32<I33<I34. The minimum current is equal to 0 in some embodiments. As shown in FIG. 8B, as the current to the middle coil 220 and/or the lower coil 230 increase, the location of the ECR zone 290 moves downwardly toward the wafer stage 260.

The location of the ECR zone 290 affects the etching condition, for example, an etching rate. Accordingly, the input current to one or more of the coils 210, 220 and 230 is changed during the etching to pattern the fin structures to move the location of the ECR zone according to the required (designed) profile of the fin structure. In some embodiments, the etching rate is adjusted in a range from about 30 nm/min to about 35 nm/min.

Figure 9A:
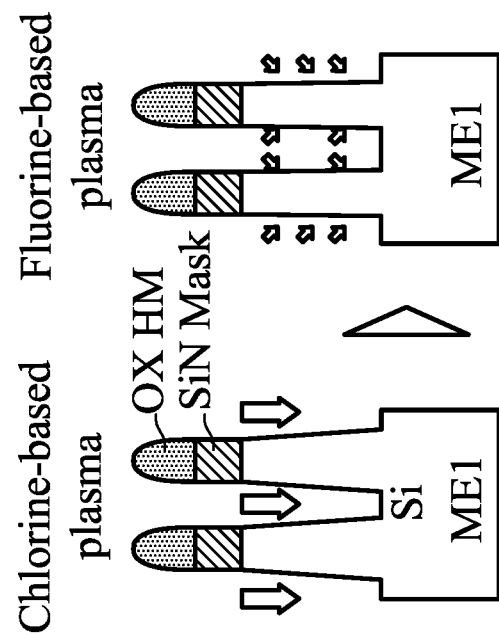
FIG. 9A shows chlorine-based plasma etching and fluorine-based plasma etching.

In addition, by changing one or more kinds of source gases, the profile of the fin structure can be adjusted. For example, as shown in FIG. 9A, when the source gas include chlorine or includes more chlorine than fluorine (chlorine-based plasma), the etching generally proceeds vertically (anisotropic), and when the source gas include fluorine or includes more fluorine than chlorine (fluorine-based plasma), the etching generally proceeds vertically and horizontally (isotropic). By combining the chlorine-based plasma and the fluorine-based plasma, it is possible to control the profile of the etched fin structures.

Figure 9B:
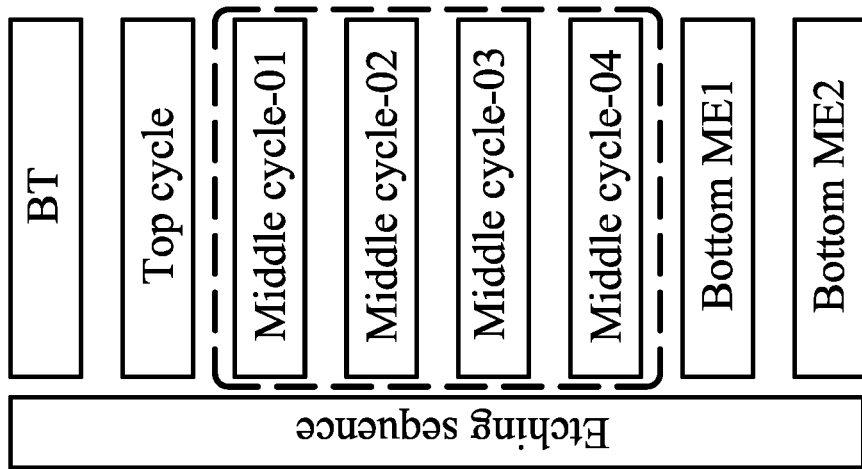

FIG. 9B shows an etching process for patterning fin structures and FIG. 9C shows source gases used in the process according to an embodiment of the present disclosure. In FIG. 9B, the BT step is a break-through etching and the Top cycle step is an initial etching process. In some embodiments, the etching process includes four middle etching cycles and two bottom etching cycles. The number of the cycles is not limited to 4 or 2, and can be any number up to 10.

As shown in FIG. 9C, various gases, such as $Cl_2$, $CHF_3$, $SF_6$, $NF_3$, $H_2$, He and Ar, are used in the middle cycles. Fmn (m=1-7 and n=1-8) indicates a flow rate of each gas. In some embodiment, each middle cycle includes first main etching ME1 and second main etching ME2. In some embodiments, in the first main etching ME1, chlorine-based plasma is used and in the second main etching ME2, fluorine-based plasma is used. By repeating the chlorine-based plasma etching anisotropic) and the fluorine-based plasma etching (isotropic), the desired profile of the fin structures is obtained.

In some embodiments, in the first main etching ME1 of each middle cycle, a mixed gas of $Cl_2$, $SF_6$, $H_2$, He and Ar is used. In addition, in the first main etching ME1 of middle cycles 3 and 4, $NF_3$ is also used. In some embodiments, the flow rates F11, F13, F15 and F17 of $Cl_2$ gas are in a range from about 80 sccm to about 120 sccm, the flow rates F31, F33, F35 and F37 of $SF_6$ gas are in a range from about 2 sccm to about 5 sccm, the flow rates F51, F53, F55 and F57 of $H_2$ gas are in a range from about 8 sccm to about 12 sccm, the flow rates F61, F63, F65 and F67 of He gas are in a range from about 120 sccm to about 180 sccm, and the flow rates F71, F73, F75 and F77 of Ar gas are in a range from about 40 sccm to about 60 sccm. The flow rates F45 and F47 of $NF_3$ gas are in a range from about 1.5 sccm to about 4.5 sccm, in some embodiments. Other flow amounts (F21, F23, F25, F27, F41 and F43) are zero in some embodiments.

In some embodiments, in the second main etching ME2 of each middle cycle, a mixed gas of $CHF_3$, and $SF_6$ is used. In some embodiments, the flow rates F23, F24, F26 and F28 of $CHF_3$ gas are in a range from about 120 sccm to about 180 sccm, and the flow rates F32, F34, F36 and F38 of $SF_6$ gas are greater than the flow rates F31, F33, F35 and F37, and are in a range from about 5 sccm to about 10 sccm. In some embodiments, F38 is greater than F32, F34 and F36. Other flow amounts (F12, F14, F16, F18, F42, F44, F46, F48, F52, F54, F56, F58, F62, F64, F66, F68, F72, F74, F76 and F78) are zero in some embodiments.

Further, in each of the first and second main etching in each middle cycle, input currents to the coils 210, 220 and 230 are adjusted. In some embodiments, the input currents I11, I12, I13, I14, I15, I16, I17 and I18 to the coil 210 are constant, and greater than the input currents to the coils 220 and 230. In some embodiments, the input currents I21, I22, I23, I24, I25, I26, I27 and I28 to the coil 220 and/or the input currents I31, I32, I33, I34, I35, I36, I37 and I38 to the coil 230 are adjusted according to the desired profile of the fin structure to move the ECR zone to an appropriate position. In some embodiments, the input currents I31, I32, I33, I34, I35, I36, I37 and I38 are set to 0 A, which can rise up the ECR zone 290 and provide large CD (less etching). In other embodiments, the input currents I31, I33, I35 and I37 are higher than input currents I32, I43, I36 and I38. In some embodiments, the input currents I31, I33, I35 and I37 set to about 6-8 A and the input current sI32, I34, I36 and I38 are set to 3-5 A, to obtain desired (e.g., standard) CD. In other embodiments, the input currents I31, I33, I35 and I37 are set to about 11-13 A, and the input currents I32, I34, I36 and I38 are set to 8-10 A, which can let down the ECR zone 290 and provide a small CD (more etching).

Figure 10:
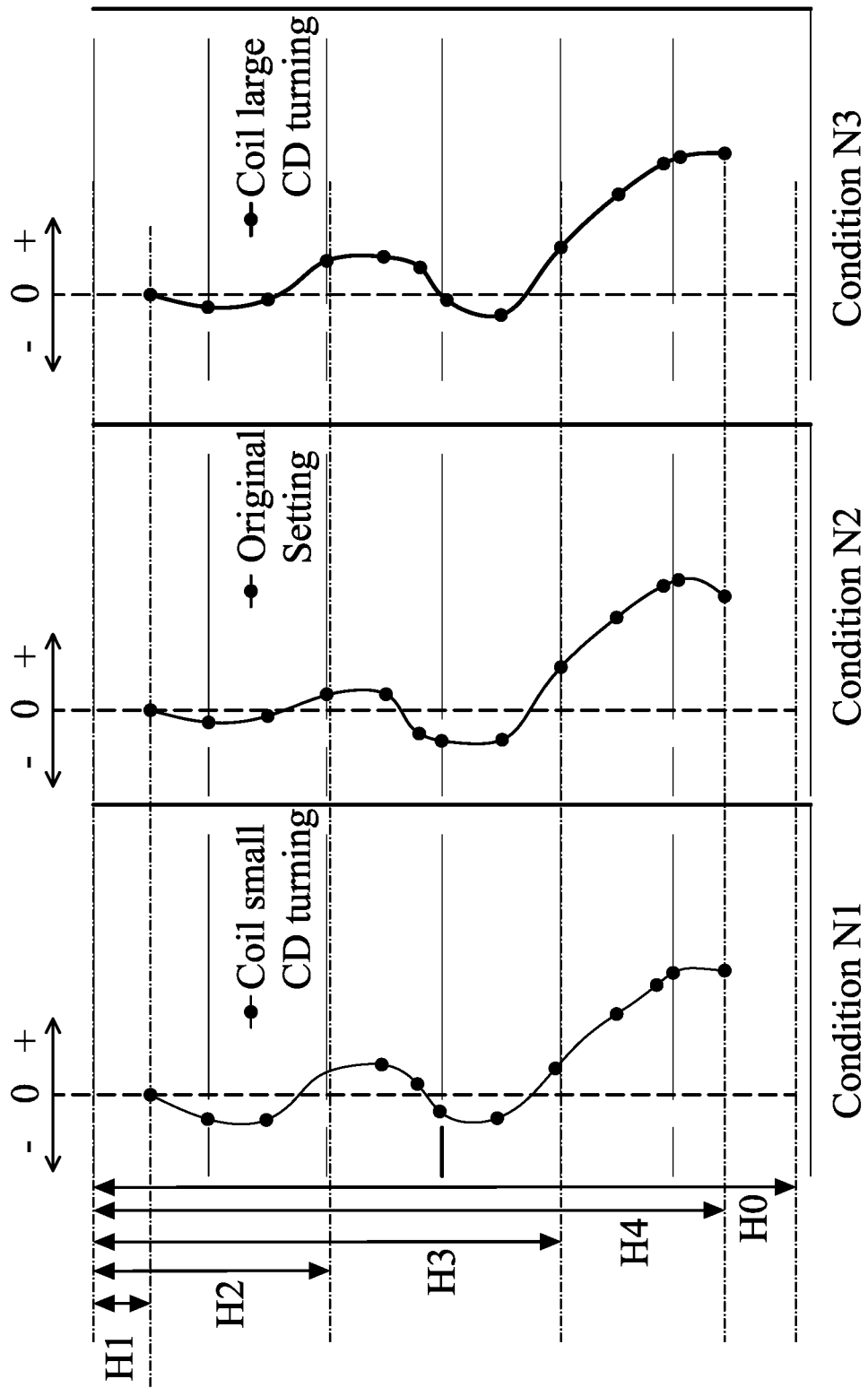
FIGS. 10 and 11 show the profiles (width variations) of the fin structures for different etching conditions.
Figure 11:
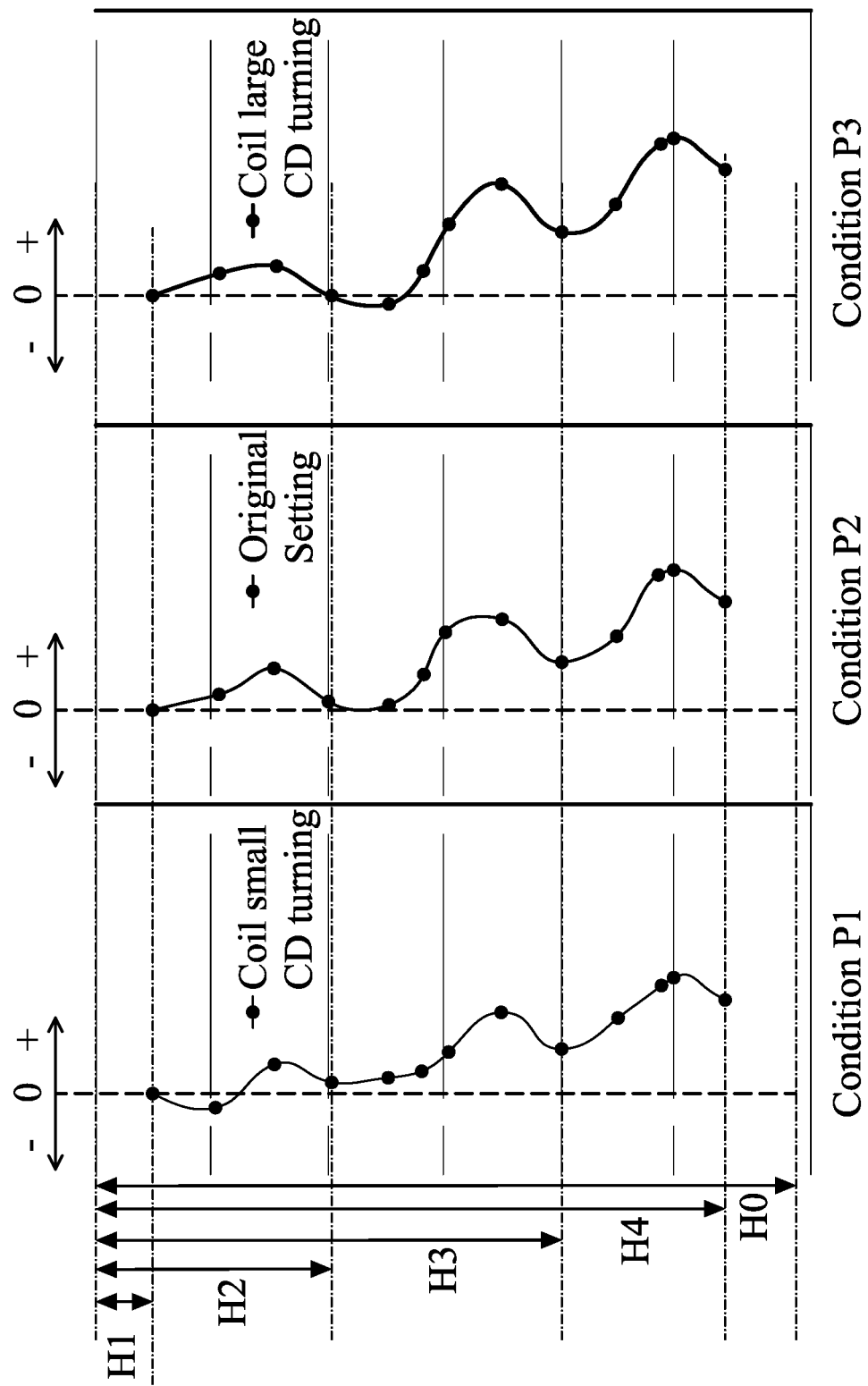

FIGS. 10 and 11 show the profiles (width variations) of the fin structures for different etching conditions. FIG. 10 shows etching results for an n-type fin structure and FIG. 11 shows etching results for a p-type fin structure. The graphs show the relative widths with respect to W1 measured at level H1 (see also, FIG. 6).

In FIG. 10, the condition N1 targets a relatively small width and the condition N3 targets a relatively large width. In the condition N1, the average etching rate of the fin etching is about 1-3% higher than that in the conditions N2, and the average etching rate of the fin etching in the condition N2 is about 1-3% higher than that in condition N3.

In some embodiments, the width W1 at the level H1 of the condition N1 is about 2-4% smaller than the width W1 of the condition N2, and the width W1 of the condition N2 is about 2-4% smaller than the width W1 of the condition N3. The width W1 is in a range from about 8 nm to about 15 nm in some embodiments, depending on the device and/or process requirements.

As shown in FIG. 10, the width of the fin structure, from the top toward the bottom, decreases, increases, decreases and the increases, having two local minimums and one local maximum (near at the level H2) as an overall trend, in some embodiments. The width W4 at around the level H4 is the largest width in some embodiments, and the local maximum of the width is smaller than the width W4. The difference between the minimum width and the local maximum is in a range from about 5% to about 10% of the width W1, and the difference between the minimum width and the maximum width is in a range from about 15% to about 20% of the width W1, in some embodiments. In some embodiments, the etched fin structure is not symmetric and thus the profile of the one main side is different from the profile of the other main side.

In FIG. 11, the condition P1 targets a relatively small width and the condition P3 targets a relatively large width. In the condition P1, the average etching rate of the fin etching is about 1-3% higher than that in the conditions P2, and the average etching rate of the fin etching in the condition P2 is about 1-3% higher than that in condition P3.

In some embodiments, the width W1 at the level H1 of the condition P1 is about 2-4% smaller than the width W1 of the condition P2, and the width W1 of the condition P2 is about 2-4% smaller than the width W1 of the condition P3. The width W1 of the p-type fin structure is smaller than the width W1 of the n-type fin structure, and is in a range from about 7 nm to about 14 nm in some embodiments, depending on the device and/or process requirements.

As shown in FIG. 11, the width of the fin structure, from the top toward the bottom, increases, decreases, increases, decreases and the increases, having two local minimums (near the levels H2 and H3) and two local maximum as an overall trend, in some embodiments. The width W4 at around the level H4 is the largest width in some embodiments, and the local maximum of the width is smaller than the width W4. The difference between the minimum width and the first local maximum is in a range from about 2% to about 5% of the width W1, difference between the minimum width and the second local maximum is in a range from about 5% to about 10% of the width W1 and the difference between the minimum width and the maximum is in a range from about 15% to about 20% of the width W1, in some embodiments. In some embodiments, the etched fin structure is not symmetric and thus the profile of the one main side is different from the profile of the other main side.

After the fin structures are formed by the ECR plasma etching, various process operations, including dry/wet etching, film deposition and/or thermal treatment, are performed, which may affect the profile of the fin structures. However, the relative dimensions as shown in FIGS. 10 and 11 is generally maintained in the final product.

Figure 12:
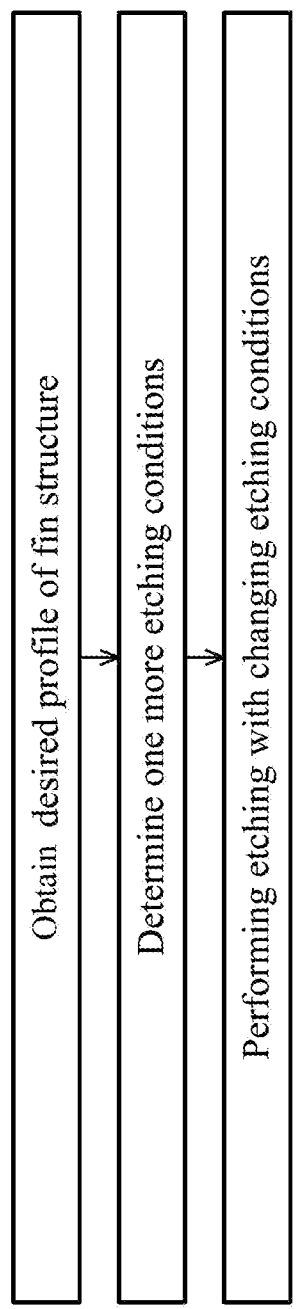
FIG. 12 shows a flow charge of an etching operation according to an embodiment of the present disclosure.

FIG. 12 shows a flow chart of an etching operation according to an embodiment of the present disclosure. In some embodiments, a desired profile is determined or obtained based on one or more device and/or process requirements. In some embodiments, the desired profile is different between an n-type FET and a p-type FET included in one device. Then, one or more etching conditions, including gas mixture, gas flow rates and input currents are applied to an ECR plasma etching apparatus. Then, the ECR plasma etching process is performed based on the determined etching conditions. As set forth above, one or more etching conditions change as the etching proceeds, to obtain the desired profile.

Although the forgoing embodiments explain etching processes for fin structures, the embodiments can be applied to other etching, for example, polysilicon etching for sacrificial gate electrode.

The various embodiments or examples described herein offer several advantages over the existing art. In the embodiments of the present disclosure, an input current to one or more coils of an ECR plasma etching apparatus is changed during an etching operation, to modify the ECR zone to control the profile (shape) of the etched pattern (e.g., silicon or SiGe fin structures). By controlling the profile of the etched patterns, it is possible to control the channel profile and/or the source/drain profile, which can improve device performance and yield.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a mask pattern is formed over a target layer to be etched, and the target layer is etched by using the mask pattern as an etching mask. The etching is performed by using an electron cyclotron resonance (ECR) plasma etching apparatus, the ECR plasma etching apparatus includes one or more coils, and a plasma condition of the ECR plasma etching is changed during the etching the target layer by changing an input current to the one or more coils. In one or more of the foregoing and following embodiments, the ECR plasma etching apparatus includes a first coil and a second coil, the second coil is located closer to a stage on which a substrate including the target layer is placed than the first coil, and an input current to the second coil is changed during the etching of the target layer. In one or more of the foregoing and following embodiments, the input current to the second coil is changed twice or more. In one or more of the foregoing and following embodiments, the input current to the second coil increases during the etching of the target layer. In one or more of the foregoing and following embodiments, the input current to the second coil decreases during the etching of the target layer. In one or more of the foregoing and following embodiments, the ECR plasma etching apparatus includes a first coil, a second coil and a third coil, the second coil is located closer to a stage on which a substrate including the target layer is placed than the first coil, and the third coil is located closer to the stage than the second coil, and at least one of an input current to the second coil or an input current to the third coil is changed during the etching of the target layer. In one or more of the foregoing and following embodiments, an input current to the first coil is constant during the etching of the target layer. In one or more of the foregoing and following embodiments, the input current to the second coil and the input current to the third coil are independently changed during the etching of the target layer. In one or more of the foregoing and following embodiments, an input current to the first coil is greater than the input current to the second coil. In one or more of the foregoing and following embodiments, the input current to the second coil is greater than the input current to the third coil.

In accordance with another aspect of the present disclosure, in a method for manufacturing a semiconductor device, a substrate having a target layer to be etched is placed on a stage of an electron cyclotron resonance (ECR) plasma etching apparatus, ECR plasma having an ECR zone is generated, and the target layer is processed by the ECR plasma. The ECR zone is moved during the processing. In one or more of the foregoing and following embodiments, the ECR zone is moved along a direction normal to the stage by controlling one or more ECR plasma parameters. In one or more of the foregoing and following embodiments, the ECR zone is move upwardly at least once and downwardly at least once. In one or more of the foregoing and following embodiments, the ECR plasma etching apparatus includes a first coil, a second coil and a third coil, the second coil is located closer to a stage on which a substrate including the target layer is placed than the first coil, and the third coil is located closer to the stage than the second coil, and the ECR zone is moved by changing at least one of an input current to the second coil or an input current to the third coil. In one or more of the foregoing and following embodiments, the ECR zone is moved downwardly by increasing at least one of the input current to the second coil or the input current to the third coil.

In accordance with another aspect of the present disclosure, in a method of manufacturing a semiconductor device, a mask pattern is formed over a target layer to be etched, ECR plasma having an ECR zone is generated by using an electron cyclotron resonance (ECR) plasma etching apparatus, and ECR plasma etching is performed on the target layer by using the mask pattern as an etching mask to form an etched pattern. In the ECR plasma etching, a target profile for the etched pattern is determined, and the ECR zone is moved along a direction normal to a principal surface of the target layer according to the target profile by controlling one or more ECR plasma parameters. In one or more of the foregoing and following embodiments, when a part of the target profile requires a smaller width, the ECR zone is moved toward the target layer, and when a part of the target profile requires a larger width, the ECR zone is moved away from the target layer. In one or more of the foregoing and following embodiments, the ECR plasma etching apparatus includes a first coil, a second coil and a third coil, the second coil is located closer to a stage on which a substrate including the target layer is placed than the first coil, and the third coil is located closer to the stage than the second coil, and the ECR zone is moved by changing at least one of an input current to the second coil or an input current to the third coil is changed. In one or more of the foregoing and following embodiments, the performing the ECR plasma further comprises changing at least one of an amount or a kind of one or more gases according to the target profile. In one or more of the foregoing and following embodiments, the ECR zone is moved a step-wise manner. In one or more of the foregoing and following embodiments, the ECR zone is moved continuously by continuously changing the input current.

In accordance with another aspect of the present disclosure, in a method of manufacturing a semiconductor device, a p-type region and an n-type region are prepared over a substrate. The p-type region includes a SiGe layer and the n-type region includes a Si layer. A hard mask layer is formed over the SiGe layer and the Si layer. The hard mask layer is patterned. The SiGe layer and the Si layer are patterned by using an electron cyclotron resonance (ECR) plasma etching apparatus. The ECR plasma etching apparatus generates an ECR zone, and the ECR zone is moved during the patterning the SiGe layer and the Si layer. In one or more of the foregoing and following embodiments, in the patterning the SiGe layer and the Si layer, the Si layer is patterned with covering the p-type region, and the SiGe layer is patterned with covering the n-type region. In one or more of the foregoing and following embodiments, a pattern pitch in the p-type region is greater than a pattern pitch in the n-type region. In one or more of the foregoing and following embodiments, the hard mask layer includes a silicon oxide layer and a silicon nitride layer formed on the silicon oxide layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, the method comprising:
   forming a mask pattern over a target layer to be etched; and
   etching the target layer by using the mask pattern as an etching mask, wherein:
   the etching is performed by using an electron cyclotron resonance (ECR) plasma etching apparatus,
   the ECR plasma etching apparatus includes a first coil and a second coil,
   the second coil is located closer to a stage on which a substrate including the target layer is placed than the first coil,
   a plasma condition of the ECR plasma etching is changed during the etching the target layer by changing an input current to the second coil twice or more.

2. The method of claim 1, wherein the input current to the second coil increases during the etching of the target layer.

3. The method of claim 1, wherein the input current to the second coil decreases during the etching of the target layer.

4. The method of claim 1, wherein:
the ECR plasma etching apparatus further includes a third coil,
the third coil is located closer to the stage than the second coil, and
an input current to the third coil is changed during the etching of the target layer.

5. The method of claim 4, wherein an input current to the first coil is constant during the etching of the target layer.

6. The method of claim 4, wherein the input current to the second coil and the input current to the third coil are independently changed during the etching of the target layer.

7. The method of claim 4, wherein an input current to the first coil is greater than the input current to the second coil.

8. The method of claim 7, wherein the input current to the second coil is greater than the input current to the third coil.

9. A method for manufacturing a semiconductor device, the method comprising:
placing a substrate having a target layer to be etched on a stage of an electron cyclotron resonance (ECR) plasma etching apparatus;
generating ECR plasma comprising an ECR zone; and
processing the target layer by the ECR plasma,
wherein the ECR zone is moved along a direction normal to the stage during the processing by controlling one or more ECR plasma parameters.

10. The method of claim 9, wherein the ECR zone is move upwardly at least once and downwardly at least once.

11. The method of claim 9, wherein:
the ECR plasma etching apparatus includes a first coil, a second coil and a third coil,
the second coil is located closer to a stage on which a substrate including the target layer is placed than the first coil, and the third coil is located closer to the stage than the second coil, and
the ECR zone is moved by changing at least one of an input current to the second coil or an input current to the third coil.

12. The method of claim 11, wherein the ECR zone is moved downwardly by increasing at least one of the input current to the second coil or the input current to the third coil.

13. The method of claim 11, wherein the ECR zone is moved according to the target profile by controlling the one or more ECR plasma parameters.

14. The method of claim 9, wherein the ECR zone is moved twice or more.

15. A method of manufacturing a semiconductor device, comprising:
forming a mask pattern over a target layer to be etched;
generating ECR plasma comprising an ECR zone by using an electron cyclotron resonance (ECR) plasma etching apparatus; and
performing ECR plasma etching on the target layer by using the mask pattern as an etching mask to form an etched pattern, wherein:
the performing the ECR plasma etching includes:
determining a target profile for the etched pattern; and
moving the ECR zone along a direction normal to a principal surface of the target layer according to the target profile by controlling one or more ECR plasma parameters.

16. The method of claim 15, wherein:
when a part of the target profile requires a smaller width, the ECR zone is moved toward the target layer, and
when a part of the target profile requires a larger width, the ECR zone is moved away from the target layer.

17. The method of claim 16, wherein:
the ECR plasma etching apparatus includes a first coil, a second coil and a third coil,
the second coil is located closer to a stage on which a substrate including the target layer is placed than the first coil, and the third coil is located closer to the stage than the second coil, and
the ECR zone is moved by changing at least one of an input current to the second coil or an input current to the third coil.

18. The method of claim 16, wherein the performing the ECR plasma etching further comprises changing at least one of an amount or a kind of one or more gases according to the target profile.

19. The method of claim 16, wherein the ECR zone is moved a step-wise manner.

20. The method of claim 15, wherein the ECR zone is moved twice or more.

* * * * *